US012660486B2

(12) United States Patent
Kim

(10) Patent No.: US 12,660,486 B2
(45) Date of Patent: Jun. 16, 2026

(54) DISPLAY APPARATUS

(71) Applicant: Samsung Display Co., LTD., Yongin-si (KR)

(72) Inventor: Myunghwan Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 432 days.

(21) Appl. No.: 18/381,724

(22) Filed: Oct. 19, 2023

(65) Prior Publication Data

US 2024/0324422 A1 Sep. 26, 2024

(30) Foreign Application Priority Data

Mar. 24, 2023 (KR) ........................ 10-2023-0039102
May 18, 2023 (KR) ........................ 10-2023-0064557

(51) Int. Cl.
*H10K 59/80* (2023.01)
*H10K 59/40* (2023.01)

(52) U.S. Cl.
CPC ......... *H10K 59/8792* (2023.02); *H10K 59/40* (2023.02)

(58) Field of Classification Search
None
See application file for complete search history.

(56) References Cited

U.S. PATENT DOCUMENTS 9,318,726 B2 4/2016 Choi et al.
9,588,265 B2 3/2017 Hino et al.
11,744,107 B2 * 8/2023 Sim ...................... H10K 59/871 257/40
2021/0200365 A1 7/2021 Lee et al.
2022/0271253 A1 * 8/2022 Jeon ..................... H10K 59/871
2022/0310970 A1 * 9/2022 Choi ...................... H10K 59/12
2022/0336714 A1 * 10/2022 Kim ..................... H10H 20/857
2023/0080858 A1 * 3/2023 Lee ....................... G06F 1/1641 361/807
2023/0265314 A1 * 8/2023 Ki ........................... G02B 1/04 257/40

FOREIGN PATENT DOCUMENTS

CN 113540158 A 10/2021
CN 115050783 A 9/2022
KR 1020160124274 A 10/2016
KR 101919172 B1 11/2018
KR 102189819 B1 12/2020
(Continued)

*Primary Examiner* — Michelle Mandala
(74) *Attorney, Agent, or Firm* — CANTOR COLBURN LLP

(57) ABSTRACT

A display apparatus includes a substrate, a display element layer on the substrate, a cover window on the display element layer, an adhesive layer between the display element layer and the cover window, a base layer between the adhesive layer and the cover window, a dye layer between the base layer and the cover window, and a window adhesive layer between the dye layer and the cover window. The dye layer includes a first dye having a maximum absorption wavelength and a second dye having a maximum absorption wavelength that is different from the maximum absorption wavelength of the first dye, and at least one of the window adhesive layer and the cover window includes an ultraviolet blocking material.

20 Claims, 7 Drawing Sheets

(56) References Cited

FOREIGN PATENT DOCUMENTS

| | | | |
|---|---|---|---|
| KR | 102204793 | B1 | 1/2021 |
| KR | 1020210112290 | A | 9/2021 |
| KR | 102313367 | B1 | 10/2021 |
| KR | 1020210120900 | A | 10/2021 |
| KR | 1020220157459 | A | 11/2022 |

* cited by examiner

DISPLAY APPARATUS

This application claims priority to Korean Patent Application No. 10-2023-0039102, filed on Mar. 24, 2023, and Korean Patent Application No. 10-2023-0064557, filed on May 18, 2023, and all the benefits accruing therefrom under 35 U.S.C. § 119, the content of which in their entirety is herein incorporated by reference.

BACKGROUND

1. Field

Embodiments relate to a light control member and a display apparatus including the same.

2. Description of the Related Art

Display apparatuses display data visually. Recently, a usage of display apparatuses is being diversified. Also, as display apparatuses are becoming thinner and more lightweight, the use thereof is being additionally expanded. For example, display apparatuses may be used for displays for small products such as mobile phones or large products such as televisions. As display apparatuses are used in various fields, the demand for display apparatuses that provide high-quality images is increasing.

SUMMARY

Embodiments include a display apparatus in which image characteristics are improved by controlling reflectance and transmittance.

Embodiments include a display apparatus in which reflection characteristics and black visibility characteristics are improved.

However, this is only an example, and the scope of the disclosure is not limited thereby.

Additional features will be set forth in part in the description which follows and, in part, will be apparent from the description, or may be learned by practice of the presented embodiments of the disclosure.

In an embodiment of the disclosure, a display apparatus includes a substrate, a display element layer on the substrate, a cover window on the display element layer, an adhesive layer between the display element layer and the cover window, a base layer between the adhesive layer and the cover window, a dye layer between the base layer and the cover window, and a window adhesive layer between the dye layer and the cover window, where the dye layer includes a first dye having a maximum absorption wavelength and a second dye having a maximum absorption wavelength that is different from the maximum absorption wavelength of the first dye, and at least one of the window adhesive layer and the cover window includes an ultraviolet blocking material.

In an embodiment, the dye layer may further include a third dye having a maximum absorption wavelength that is different from the maximum absorption wavelengths of the first dye and the second dye, and a fourth dye having a maximum absorption wavelength that is different from the maximum absorption wavelengths of the first dye, the second dye, and the third dye.

In another embodiment, the dye layer may have a transmittance of about 30% to about 80% with respect to light having a wavelength of about 455 nanometers (nm) to about 475 nm, may have a transmittance of about 30% to about 80% with respect to light having a wavelength of about 520 nm to about 540 nm, and may have a transmittance of about 30% to about 80% with respect to light having a wavelength of about 620 nm to about 640 nm.

In another embodiment, a stacked structure including the window adhesive layer and the cover window may have a transmittance of about 2% or less with respect to light having a wavelength of about 300 nm to about 380 nm.

In another embodiment, the window adhesive layer may include an organic ultraviolet blocking material.

In another embodiment, the cover window may include an inorganic ultraviolet blocking material.

In another embodiment, the display apparatus may further include a touch sensor layer on the display element layer, where the adhesive layer may contact at least a portion of an upper surface of the touch sensor layer.

In another embodiment, the display apparatus may further include light-blocking patterns on the touch sensor layer and defining upper openings, where the adhesive layer may cover the light-blocking patterns and may extend into the upper openings.

In another embodiment, the adhesive layer may have a transmittance of about 80% to about 99.5% with respect to light having a wavelength of about 710 nanometers (nm) to about 1,000 nm, the base layer may have a transmittance of about 80% to about 99.5% with respect to light having a wavelength of about 710 nm to about 1,000 nm, and the dye layer may have a transmittance of about 80% to about 99.5% with respect to light having a wavelength of about 710 nm to about 1,000 nm.

In another embodiment, each of the adhesive layer, the base layer, and the dye layer may not include bismuth.

In another embodiment, the display apparatus may further include a capping layer on the display element layer and including an organic material, and an encapsulation layer on the capping layer, where the encapsulation layer may be disposed directly on the capping layer so that the encapsulation layer may contact the capping layer.

In another embodiment, the display element layer may include a pixel electrode, an emission layer, and an opposite electrode, which are sequentially stacked, and the capping layer may be between the opposite electrode and the encapsulation layer.

In an embodiment of the disclosure, a display apparatus includes a substrate, a display panel on the substrate and including a display element layer and a light control member, and a cover window on the light control member, where the light control member includes an adhesive layer, a base layer, and a dye layer, which are stacked on the display element layer, the dye layer is between the base layer and the cover window, the dye layer includes a first dye having a first maximum absorption wavelength, a second dye having a second maximum absorption wavelength, a third dye having a third maximum absorption wavelength, and a fourth dye having a fourth maximum absorption wavelength, and the dye layer has a transmittance of about 30% to about 80% with respect to light having a first wavelength of about 455 nm to about 475 nm, has a transmittance of about 30% to about 80% with respect to light having a second wavelength of about 520 nm to about 540 nm, and has a transmittance of about 30% to about 80% with respect to light having a third wavelength of about 620 nm to about 640 nm.

In another embodiment, the first wavelength may be a wavelength between the first maximum absorption wavelength and the second maximum absorption wavelength, the second wavelength may be a wavelength between the second maximum absorption wavelength and the third maximum absorption wavelength, and the third wavelength may be a wavelength between the third maximum absorption wavelength and the fourth maximum absorption wavelength.

In another embodiment, a content ratio of the first dye in the dye layer may be in a range of about 0.01 weight percent (wt %) to about 2 wt %, a content ratio of the second dye in the dye layer may be in a range of about 0.01 wt % to about 2 wt %, a content ratio of the third dye in the dye layer may be in a range of about 0.01 wt % to about 2 wt %, and a content ratio of the fourth dye in the dye layer may be in a range of about 0.01 wt % to about 2 wt %.

In another embodiment, the display panel may have a specular component included ("SCI") reflectance of about 4% to about 6.5%.

In another embodiment, the display panel may have a specular component excluded ("SCE") reflectance of about 0.2% to about 1%.

In another embodiment, the dye layer may have a transmittance of about 80% to about 99.5% with respect to light having a wavelength of about 900 nm to about 1,000 nm.

In another embodiment, the display apparatus may further include a thin-film encapsulation layer on the display element layer, a touch sensor layer on the thin-film encapsulation layer, and a window adhesive layer between the dye layer and the cover window, where the adhesive layer may be disposed on the touch sensor layer, and the window adhesive layer may contact an upper surface of the dye layer.

In another embodiment, the dye layer may include a transmissive polymer.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1:
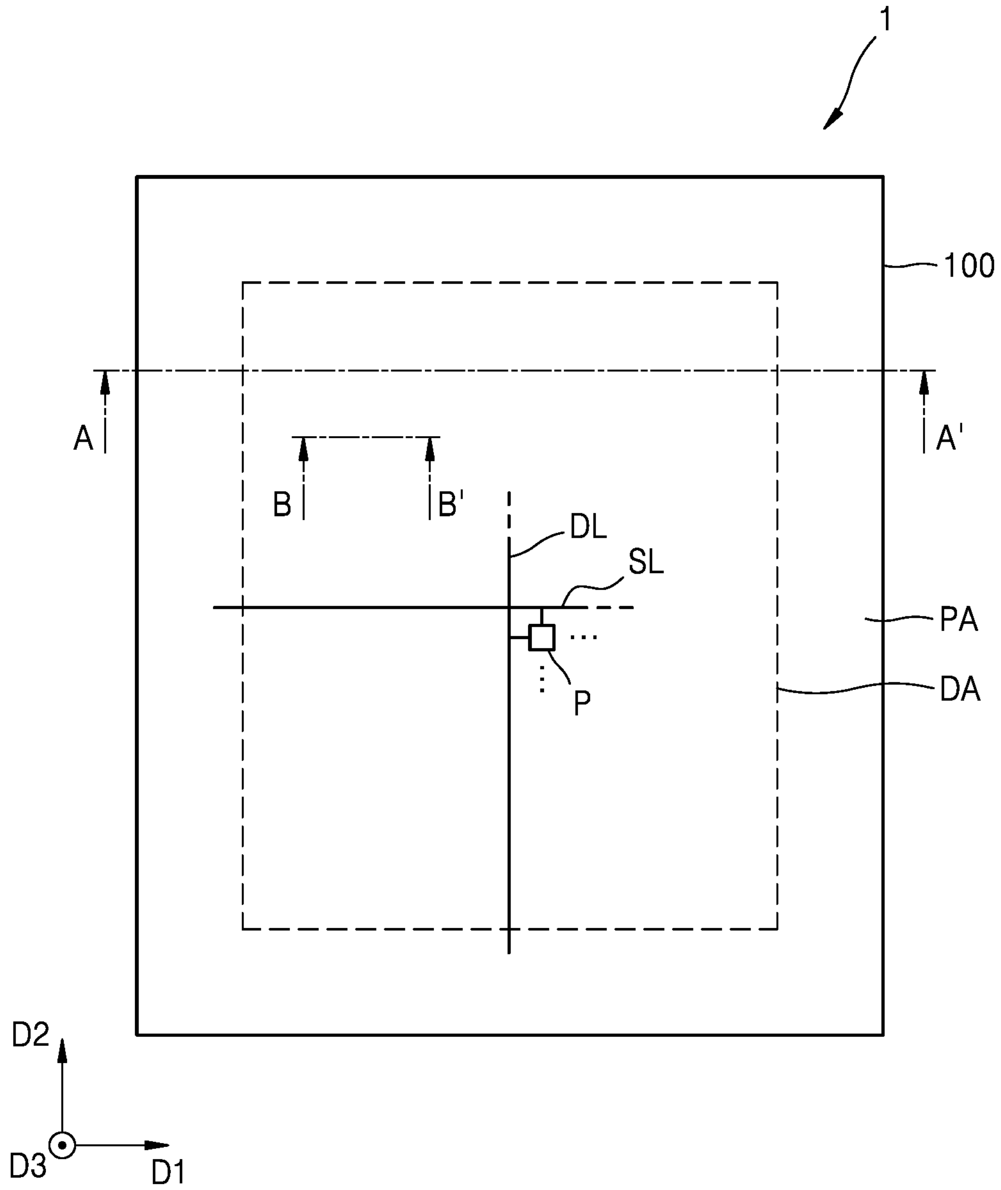
FIG. 1 is a plan view schematically illustrating an embodiment of a display apparatus.

Reference will now be made in detail to embodiments, embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the description allows for various changes and numerous embodiments, illustrative embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the terms "first," "second," etc. may be used herein to describe various elements, these elements should not be limited by these terms. These terms are only used to distinguish one element from another.

The singular forms as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When an illustrative embodiment may be implemented differently, a predetermined process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or elements are referred to as being electrically connected to each other, they may be directly electrically connected to each other or indirectly electrically connected to each other with intervening layers, regions, or elements therebetween.

Throughout the disclosure, the expression "A and/or B" indicates only A, only B, or both A and B. In this specification, the expression "at least one of A and B" indicates only A, only B, or both A and B.

In the specification, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

The terms "about" or "approximately" used herein to refer to any numerical value may mean including numerical values within a range generally acceptable in the art due to measurement limitations or errors. For example, "about" may mean including values within a range of ±30%, ±20%, ±10%, or ±5% of any numerical value.

Like reference numerals may denote like elements throughout the specification.

Hereinafter, a display apparatus and a method of manufacturing the same, in embodiments, will be described.

Figure 2:
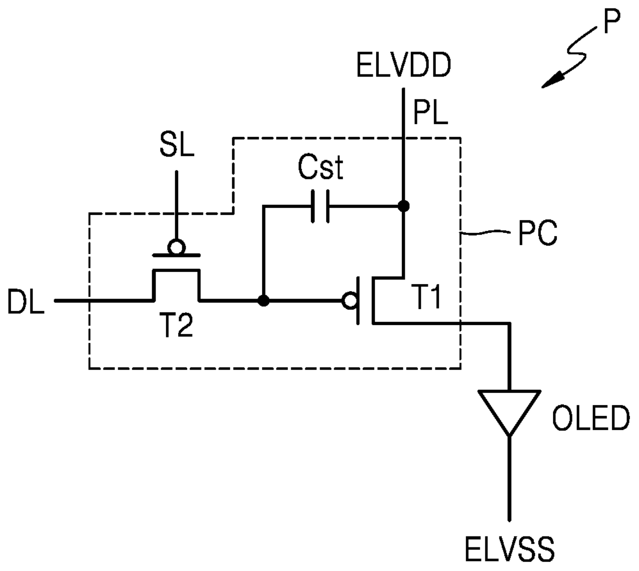
FIG. 2 is an equivalent circuit diagram of an embodiment of a pixel.

FIG. 1 is a plan view schematically illustrating an embodiment of a display apparatus 1. FIG. 2 is an equivalent circuit diagram of an embodiment of a pixel P.

Referring to FIGS. 1 and 2, the display apparatus 1 in an embodiment may include a display area DA and a peripheral area PA. The peripheral area PA may be disposed outside the display area DA to surround the display area DA. A driving circuit and various wirings which transmit electrical signals to be applied to the display area DA may be disposed in the peripheral area PA. The display apparatus 1 may provide a predetermined image by light emitted from a plurality of pixels P arranged in the display area DA.

Hereinafter, an organic light-emitting display is described in an embodiment of the display apparatus 1, but the display apparatus according to the disclosure is not limited thereto. In embodiments, the display apparatus 1 may include an organic light-emitting display, an inorganic light-emitting display (or an inorganic electroluminescence ("EL") display), a quantum dot light-emitting display, or the like.

The display apparatus 1 may implemented as various types of electronic apparatuses. In an embodiment, the display apparatus 1 may be a vehicle display apparatus, but the display apparatus 1 according to the disclosure is not limited thereto.

Each of the pixels P may include a display element such as an organic light-emitting diode or an inorganic light-emitting diode, and may emit red light, green light, blue light, or white light, for example. That is, each of the pixels P may be connected to a pixel circuit PC including first and second thin-film transistors T1 and T2 and a storage capacitor Cst, as illustrated in FIG. 2. The pixel circuit PC may be connected to a scan line SL, a data line DL crossing the scan line SL, and a driving voltage line PL. In an embodiment, as illustrated in FIG. 1, the scan line SL may extend in a first direction D1 and the data line DL and the driving voltage line PL may extend in a second direction D2. The second direction D2 may cross the first direction D1. A third direction D3 may cross the first direction D1 and the second direction D2. In an embodiment, the first direction D1 may be the x-axis direction, the second direction D2 may be the y-axis direction, and the third direction D3 may be the z-axis direction, for example, but the disclosure is not limited thereto.

The pixel circuit PC may drive each of the pixels P to emit light, and the display area DA may provide a predetermined image through the light emitted from the pixels P. The pixel P as used herein may be defined as an emission area configured to emit one of red light, green light, blue light, and white light, as described above.

The peripheral area PA is an area in which the pixels P are not arranged and through which an image is not provided. Terminals, to which an internal driving circuit configured to drive the pixels P, a power supply line, and a printed circuit board or a driver integrated circuit ("IC") including a driving circuit are connected, may be arranged in the peripheral area PA.

In each of the pixels P, a display element (e.g., an organic light-emitting diode OLED) may be connected to the pixel circuit PC. As illustrated in FIG. 2, the pixel circuit PC may include a first thin-film transistor T1, a second thin-film transistor T2, and a storage capacitor Cst. The organic light-emitting diode OLED may emit red light, green light, or blue light, for example, or may emit red light, green light, blue light, or white light, for example. However, the disclosure is not limited thereto, and the organic light-emitting diode OLED may emit various other color lights.

The second thin-film transistor T2 is a switching thin-film transistor and may be connected to the scan line SL and the data line DL. The second thin-film transistor T2 may transmit, to the first thin-film transistor T1, a data voltage input from the data line DL in response to a switching voltage input from the scan line SL.

The storage capacitor Cst may be connected to the second thin-film transistor T2 and the driving voltage line PL. The storage capacitor Cst may store a voltage corresponding to a difference between a voltage received from the second thin-film transistor T2 and a first power supply voltage ELVDD supplied to the driving voltage line PL.

The first thin-film transistor T1 is a driving thin-film transistor and may be connected to the driving voltage line PL and the storage capacitor Cst. The first thin-film transistor T1 may control a driving current flowing from the driving voltage line PL to the organic light-emitting diode OLED according to a voltage value stored in the storage capacitor Cst. The organic light-emitting diode OLED may emit light having a predetermined luminance according to the driving current. An opposite electrode (e.g., a cathode) of the organic light-emitting diode OLED may receive a second power supply voltage ELVSS. However, the disclosure is not limited thereto, and the organic light-emitting diode OLED may receive a ground voltage.

Figure 3:
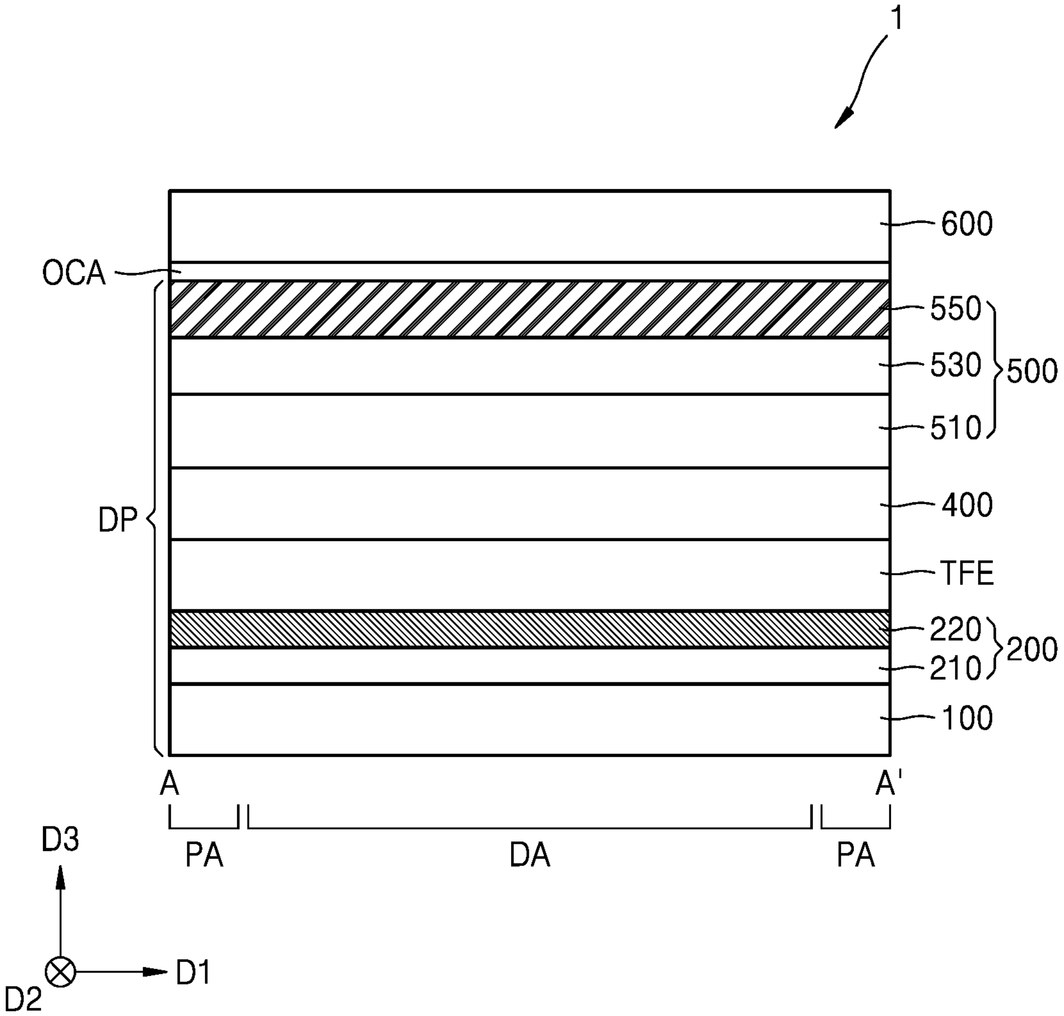
FIG. 3 is a schematic cross-sectional view of an embodiment of the display apparatus of FIG. 1 taken along line A-A' of FIG. 1.

FIG. 3 is a schematic cross-sectional view of an embodiment of the display apparatus 1 of FIG. 1 taken along line A-A' of FIG. 1. Hereinafter, the same description as provided above is omitted.

As illustrated in FIG. 3, the display apparatus 1 may include a display panel DP and a cover window 600. The display panel DP may include a substrate 100, a pixel layer 200, an encapsulation layer TFE, a touch sensor layer 400, and a light control member 500, which are sequentially stacked.

The substrate 100 may include glass or polymer resin. In an embodiment, the substrate 100 may include glass including silicon oxide ($SiO_x$) as a main component or may include polymer resin, such as polyethersulfone ("PES"), polyarylate, polyetherimide, polyethylene naphthalate ("PEN"), polyethylene terephthalate ("PET"), polyphenylene sulfide, polyimide ("PI"), polycarbonate ("PC"), cellulose triacetate ("TAC"), and/or cellulose acetate propionate, for example.

The pixel layer 200 may be disposed on the substrate 100. The pixel layer 200 may include a pixel circuit layer 210 and a display element layer 220. The display element layer 220 may include a display element. The pixel circuit layer 210 may include a pixel circuit (PC in FIG. 2) and insulating layers. The display element may include an organic light-emitting diode or an inorganic light-emitting diode. The display element layer 220 may be disposed on the pixel circuit layer 210, and a plurality of insulating layers may be between the pixel circuit and the display element. Some lines and insulating layers of the pixel circuit layer 210 may extend up to the peripheral area PA.

The encapsulation layer TFE may be disposed on the pixel layer 200. The encapsulation layer TFE may seal the display element disposed in the display element layer 220. In an embodiment, the encapsulation layer TFE may include at least one inorganic encapsulation layer and at least one organic encapsulation layer. The at least one inorganic encapsulation layer may include at least one inorganic material selected from aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include acrylic resin, epoxy-based resin, PI, polyethylene, or the like. In an embodiment, the at least one organic encapsulation layer may include acrylate.

The touch sensor layer 400 may be disposed on the encapsulation layer TFE. The touch sensor layer 400 may sense a touch input of a user. The touch sensor layer 400 may sense a touch input of a user by a resistive method or a capacitive method. Unlike the embodiment illustrated in FIG. 3, at least one of the encapsulation layer TFE and the touch sensor layer 400 may be omitted in another embodiment.

The cover window 600 may be disposed on the display panel DP. The cover window 600 may be transparent. The cover window 600 may protect the display panel DP. The cover window 600 may include at least one of glass, sapphire, or plastic. The cover window 600 may be ultra-thin glass ("UTG") or colorless polyimide ("CPI"), for example.

The light control member 500 may be between the touch sensor layer 400 and the cover window 600. The light control member 500 may include an adhesive layer 510, a base layer 530, and a dye layer 550, which are stacked in this stated order. The adhesive layer 510 may be disposed on the touch sensor layer 400. The adhesive layer 510 may be a pressure sensitive adhesive ("PSA") layer. In an embodiment, the adhesive layer 510 may bond the base layer 530 to the touch sensor layer 400, for example. The adhesive layer 510 may be in direct contact with the upper surface of the touch sensor layer 400.

The base layer 530 may be disposed on the adhesive layer 510. The base layer 530 may be transparent. The base layer 530 may include a polymer. The base layer 530 may function as a substrate for forming the dye layer 550.

The dye layer 550 may be disposed on the base layer 530. The dye layer 550 may include different dyes. In an embodiment, the dye layer 550 may include at least four types of dyes, for example. In an embodiment, the dye layer 550 may include a first dye, a second dye, a third dye, and a fourth dye, for example. The first dye, the second dye, the third dye, and the fourth dye may have different chemical structures from each other and include different materials from each other. The transmittance and reflectance of the dye layer 550 according to a wavelength band may be controlled by the types of the first to fourth dyes included in the dye layer 550, the range of the maximum absorption wavelength of each of the first to fourth dyes, and the composition ratio of the first to fourth dyes. Accordingly, image characteristics of the display apparatus 1 may be improved. The dye layer 550 may be formed by performing a hard coating process on the base layer 530, for example.

The display apparatus 1 may further include a window adhesive layer OCA. The window adhesive layer OCA may be between the dye layer 550 and the cover window 600. The window adhesive layer OCA may contact the upper surface of the dye layer 550 and the lower surface of the cover window 600. The cover window 600 may be bonded to the dye layer 550 through the window adhesive layer OCA. The window adhesive layer OCA may be an optically clear adhesive, but the disclosure is not limited thereto. At least one of the window adhesive layer OCA and the cover window 600 may include an ultraviolet blocking material.

By embodiments, a reflection control layer including bismuth may not be provided in the display element layer 220. In addition, the display apparatus 1 may not include a layer including bismuth on the display element layer 220. Accordingly, an electronic apparatus including the display apparatus 1 may function as an under panel sensor ("UPS") or an under panel camera ("UPC").

Hereinafter, the light control member 500 and the display apparatus 1 including the same, in embodiments, will be described in detail.

Figure 4A:
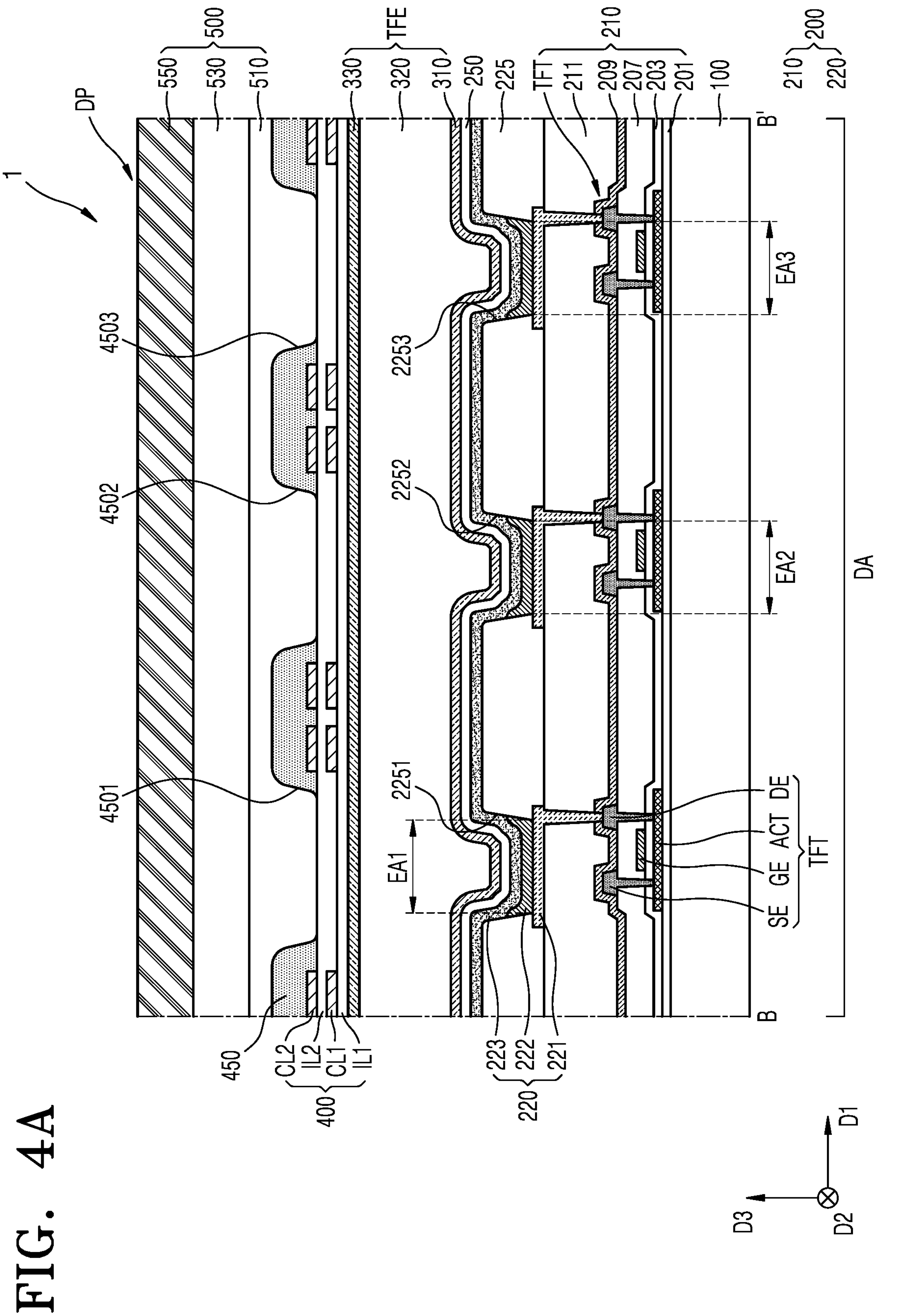
FIG. 4A is a cross-sectional view of an embodiment of a display panel of the display apparatus of FIG. 1 taken along line B-B' of FIG. 1.
Figure 4B:
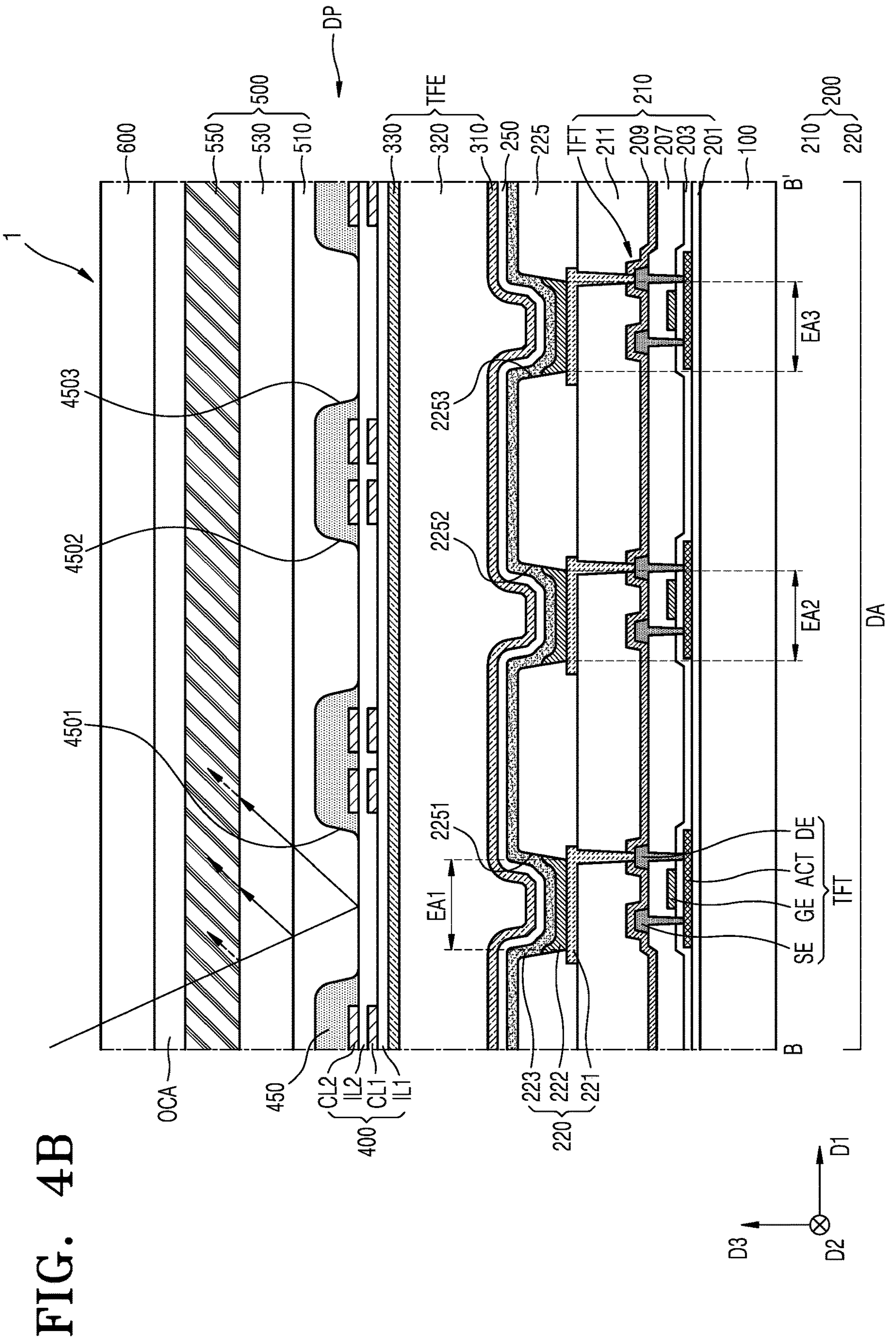
FIG. 4B is a cross-sectional view for describing an embodiment of a display apparatus including a light control member.

FIG. 4A is a cross-sectional view of an embodiment of the display panel of the display apparatus 1 taken along line B-B' of FIG. 1. FIG. 4B is a cross-sectional view of an embodiment of the display apparatus 1 including the light control member 500 taken along line B-B' of FIG. 1.

Referring to FIGS. 4A and 4B, the display apparatus 1 in an embodiment may include a substrate 100, a pixel layer 200, an encapsulation layer TFE, a touch sensor layer 400, the light control member 500, a window adhesive layer OCA, and a cover window 600.

The pixel layer 200 may include a pixel circuit layer 210 and a display element layer 220. The pixel circuit layer 210 may be disposed on the substrate 100. The pixel circuit layer 210 may include a thin-film transistor TFT and a storage capacitor (Cst in FIG. 2). The pixel circuit layer 210 may further include a buffer layer 201, a gate insulating layer 203, an inter-insulating layer 207, a protective layer 209, and a planarization insulating layer 211.

The thin-film transistor TFT may include a semiconductor layer ACT, a gate electrode GE, a source electrode SE, and a drain electrode DE. The semiconductor layer ACT may include amorphous silicon, polycrystalline silicon, or an organic semiconductor material. The gate insulating layer 203 may be between the semiconductor layer ACT and the gate electrode GE. The gate insulating layer 203 may secure electrical insulation between the semiconductor layer ACT and the gate electrode GE. The gate insulating layer 203 may include an inorganic material, such as silicon oxide ($SiO_x$), silicon nitride ($SiN_x$), and/or silicon oxynitride (SiON). The gate insulating layer 203 may be formed by chemical vapor deposition ("CVD") or atomic layer deposition ("ALD").

The inter-insulating layer 207 may be disposed on the gate electrode GE. The inter-insulating layer 207 may include an inorganic material, such as silicon oxide ($SiO_x$), silicon nitride ($SiN_x$), and/or silicon oxynitride (SiON).

The source electrode SE and the drain electrode DE may be disposed in the inter-insulating layer 207. In another embodiment, one of the source electrode SE and the drain electrode DE may be omitted and replaced with a conductive semiconductor layer ACT. In another embodiment, source electrode SE and the drain electrode DE may be interchanged with each other based on a type of the thin-film transistor TFT.

The gate electrode GE, the source electrode SE, and the drain electrode DE may each include various conductive materials. The gate electrode GE may include at least one of molybdenum (Mo), aluminum (Al), copper (Cu), or titanium (Ti), and may have a multilayer structure when desired. In an embodiment, the gate electrode GE may be a single molybdenum (Mo) layer, for example. In an alternative embodiment, the gate electrode GE may have a three-layer structure including a molybdenum layer, an aluminum layer, and a molybdenum layer. The source electrode SE and the drain electrode DE may each include at least one of copper (Cu), titanium (Ti), or aluminum (Al), and may each have a multilayer structure when desired. In an embodiment, the source electrode SE and the drain electrode DE may each have a three-layer structure including a titanium layer, an aluminum layer, and a titanium layer, for example.

The protective layer 209 may be disposed on the inter-insulating layer 207 and cover the inter-insulating layer 207, the source electrode SE, and the drain electrode DE. The protective layer 209 may prevent a metal line (e.g., aluminum), which may be damaged by an etchant, from being exposed to an etching environment in a process of manufacturing the display apparatus 1.

The buffer layer 201 may be between the thin-film transistor TFT and the substrate 100. The buffer layer 201 may include an inorganic material, such as silicon oxide ($SiO_x$), silicon nitride ($SiN_x$), and/or silicon oxynitride (SiON). The buffer layer 201 may increase the smoothness of the upper surface of the substrate 100, or may prevent or minimize infiltration of impurities from the substrate 100 or the like to the semiconductor layer ACT of the thin-film transistor TFT.

The planarization insulating layer 211 may be disposed on the protective layer 209. The planarization insulating layer 211 may include an organic material, such as acryl, benzocyclobutene ("BCB"), or hexamethyldisiloxane ("HMDSO"). Although FIG. 4A illustrates that the planarization insulating layer 211 is a single layer, the planarization insulating layer 211 may be multiple layers.

The display element layer 220 may include a display element (e.g., an organic light-emitting diode). In an embodiment, the display element layer 220 may include a pixel electrode 221, an emission layer 222, and an opposite electrode 223, for example.

The pixel electrode 221 may be disposed on the planarization insulating layer 211. The pixel electrode 221 may be disposed for each pixel (P in FIG. 1). Portions of the pixel electrodes 221 corresponding to the neighboring pixels P may be spaced apart from each other. The pixel electrode 221 may be a transmissive electrode, a semi-transmissive electrode, or a reflective electrode. In an embodiment, the pixel electrode 221 may include a reflective layer and an electrode layer. At this time, the reflective layer may include Ag, Mg, Al, Pt, Pd, Au, Ni, Nd, Ir, Cr, and any combinations thereof. The electrode layer may be disposed on the reflective layer and may be transparent or semitransparent. The electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, the pixel electrode 221 may include a stack structure of ITO/Ag/ITO, for example.

A pixel defining layer 225 may be disposed on the pixel electrode 221. A first lower opening 2251, a second lower opening 2252, and a third lower opening 2253 respectively exposing the upper surfaces of the pixel electrodes 221 may be defined in the pixel defining layer 225. The first lower opening 2251, the second lower opening 2252, and the third lower opening 2253 may respectively define first to third emission areas EA1, EA2, and EA3 of the pixels (P in FIG. 1). In an embodiment, the first lower opening 2251 may define the first emission area EA1, the second lower opening 2252 may define the second emission area EA2, and the third lower opening 2253 may define the third emission area EA3, for example. At this time, light having a first wavelength may be emitted from the display element layer 220 of the first emission area EA1. The light having the first wavelength may be visible light. The first wavelength may be in a range of about 455 nm to about 475 nm. The first wavelength may correspond to a wavelength of blue light. Light having a second wavelength may be emitted from the display element layer 220 of the second emission area EA2. The light having the second wavelength may be visible light. The second wavelength may be different from the first wavelength. In an embodiment, the second wavelength may be in a range of about 520 nm to about 540 nm, for example. The second wavelength may correspond to a wavelength of green light. Light having a third wavelength may be emitted from the display element layer 220 of the third emission area EA3. The light having the third wavelength may be visible light. The third wavelength may be different from the first wavelength and the second wavelength. In an embodiment, the third wavelength may be in a range of about 620 nm to about 640 nm, for example. The third wavelength may correspond to a wavelength of red light. That is, blue light may be emitted from the first emission area EA1, green light may be emitted from the second emission area EA2, and red light may be emitted from the third emission area EA3.

The pixel defining layer 225 may prevent an electric arc or the like from occurring on the edge of the pixel electrode 221 by covering the edge of the pixel electrode 221 and increasing the distance between the edge of the pixel electrode 221 and the opposite electrode 223. The pixel defining layer 225 may include an organic insulating material, such as PI, polyamide, acrylic resin, HMDSO, and phenol resin, and may be formed by spin coating. In an alternative embodiment, the pixel defining layer 225 may include an inorganic insulating material. In an alternative embodiment, the pixel defining layer 225 may have a multilayer structure including an inorganic insulating material and an organic insulating material.

In an embodiment, the pixel defining layer 225 may be a black matrix. In an embodiment, the pixel defining layer 225 may include a light-blocking material and may be provided in black, for example. The light-blocking material may include carbon black, carbon nanotubes, a resin or paste including black dye, metal particles (e.g., nickel, aluminum, molybdenum, and any alloy thereof), metal oxide particles (e.g., chromium oxide), or metal nitride particles (e.g., chromium nitride). In another embodiment, the pixel defining layer 225 may include an organic insulating material or an inorganic insulating material.

The emission layer 222 may be disposed on the pixel electrode 221. The emission layer 222 may include an organic material including a fluorescent or phosphorescent material capable of emitting red light, green light, or blue light. The organic material described above may include a relatively low molecular weight organic material or a relatively high molecular weight organic material. The emission layer 222 may be disposed to correspond to the pixel electrode 221.

A first common layer (not shown) and/or a second common layer (not shown) may be respectively disposed below and above the emission layer 222. The first common layer may be disposed below the emission layer 222 and may include a hole transport layer ("HTL"), for example, or may include an HTL and a hole injection layer ("HIL"), for example. The second common layer may be disposed above the emission layer 222 and may include an electron transport layer ("ETL") and/or an electron injection layer ("EIL"). In some embodiments, the second common layer may not be provided Like the opposite electrode 223 to be described below, the first common layer and the second common layer may be common layers unitary to completely cover the substrate 100, e.g., the display area of the substrate 100.

The opposite electrode 223 may be a cathode that is an electron injection electrode. In this case, as a material for the opposite electrode 223, a metal, an alloy, an electrically conductive compound, or any combinations thereof, which each has a relatively low work function, may be used. The opposite electrode 223 may be a transmissive electrode, a transflective electrode, or a reflective electrode. The opposite electrode 223 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combinations thereof. The opposite electrode 223 may have a single-layer structure including a single layer or a multilayer structure including multiple layers.

The display apparatus 1 may further include a capping layer 250. The capping layer 250 may be disposed on the opposite electrode 223. The capping layer 250 may include an organic material and may protect the opposite electrode 223. In an embodiment, the capping layer 250 may also improve external light emission efficiency of the organic light-emitting device, based on the principle of constructive interference, for example. In this case, the capping layer 250 may have a refractive index of about 1.7 to about 2.1. The capping layer 250 may be formed by a deposition process.

The encapsulation layer TFE may be disposed on the display element layer 220. The encapsulation layer TFE may include at least one inorganic encapsulation layer and at least one organic encapsulation layer. By embodiments, the encapsulation layer TFE may include a first inorganic encapsulation layer 310, a second inorganic encapsulation layer 330, and an organic encapsulation layer 320. The first inorganic encapsulation layer 310 may be disposed on the opposite electrode 223. In this case, the capping layer 250 may be between the opposite electrode 223 and the first inorganic encapsulation layer 310. The first inorganic encapsulation layer 310 may include an inorganic insulating material. The inorganic insulating material may include aluminum oxide, titanium oxide, tantalum oxide, hafnium oxide, zinc oxide, silicon oxide, silicon nitride, or/and silicon oxynitride. The first inorganic encapsulation layer 310 may be formed by CVD.

By embodiments, a layer including bismuth may not be between the capping layer 250 and the encapsulation layer TFE. Accordingly, the first inorganic encapsulation layer 310 may be disposed directly on the capping layer 250 and may contact the capping layer 250.

The organic encapsulation layer 320 may be disposed on the upper surface of the first inorganic encapsulation layer 310 and cover the upper surface of the first inorganic encapsulation layer 310. The organic encapsulation layer 320 may include a polymer. The polymer may include acrylic resin, epoxy-based resin, PI, polyethylene, or the like. In an embodiment, the organic encapsulation layer 320 may include acrylic resin, such as polymethyl methacrylate and/or polyacrylic acid, for example. The organic encapsulation layer 320 may be formed by curing a monomer or applying a polymer. The organic encapsulation layer 320 may cover irregularities of the display element layer 220, and thus, the upper surface of the organic encapsulation layer 320 may be flatter than the upper surface of the first inorganic encapsulation layer 310.

The second inorganic encapsulation layer 330 may be disposed on the upper surface of the organic encapsulation layer 320. The second inorganic encapsulation layer 330 may include the inorganic insulating material described in the embodiment of the first inorganic encapsulation layer 310. The second inorganic encapsulation layer 330 may be formed by CVD.

The touch sensor layer 400 may be disposed on the encapsulation layer TFE. The touch sensor layer 400 may include a first inorganic insulating layer IL1, a first conductive layer CL1, a second inorganic insulating layer IL2, and a second conductive layer CL2. The first inorganic insulating layer IL1 may be disposed on the second inorganic encapsulation layer 330. The first inorganic insulating layer IL1 may have a single-layer or multilayer structure. The first inorganic insulating layer IL1 may include an inorganic material or a composite material. In an embodiment, the first inorganic insulating layer IL1 may include an inorganic layer, for example. The inorganic layer may include at least one of aluminum oxide, titanium oxide, silicon oxide, silicon oxynitride, zirconium oxide, or hafnium oxide.

The second inorganic insulating layer IL2 may be disposed on the first inorganic insulating layer IL1. The second inorganic insulating layer IL2 may have a single-layer structure or a multilayer structure. The second inorganic insulating layer IL2 may include an inorganic material or a composite material. In an embodiment, the second inorganic insulating layer IL2 may include an inorganic layer as described in the embodiment of the first inorganic insulating layer IL1, for example.

The first conductive layer CL1 may be disposed on the upper surface of the first inorganic insulating layer IL1. The first conductive layer CL1 may be between the first inorganic insulating layer IL1 and the second inorganic insulating layer IL2.

The second conductive layer CL2 may be disposed on the upper surface of the second inorganic insulating layer IL2. The second conductive layer CL2 may be electrically connected to the first conductive layer CL1 through a contact hole (not shown). The contact hole may be provided in the second inorganic insulating layer IL2.

The first conductive layer CL1 and the second conductive layer CL2 may correspond to a sensing electrode. The sensing electrode may not overlap the first to third emission areas EA1, EA2, and EA3 and may overlap the non-emission areas. In this case, the non-emission areas may be areas between the first to third emission areas EA1, EA2, and EA3 in a plan view. The first conductive layer CL1 and the second conductive layer CL2 may have a mesh shape in a plan view.

The first conductive layer CL1 and the second conductive layer CL2 may each have a single-layer structure or a stacked multilayer structure. The first conductive layer CL1 and the second conductive layer CL2 may each include a metal layer or a transparent conductive layer. The metal layer may include molybdenum, silver, titanium, copper, aluminum, and any alloy thereof. The transparent conductive layer may include a transparent conductive oxide, such as ITO, IZO, ZnO, and/or indium tin zinc oxide ("ITZO"). In another embodiment, the transparent conductive layer may include a conductive polymer such as poly(3,4-ethylene dioxythiophene ("PEDOT"), metal nanowires, graphene, or the like.

The display apparatus 1 may include light-blocking patterns 450. The light-blocking patterns 450 may be disposed on the touch sensor layer 400. In an embodiment, the light-blocking patterns 450 may be disposed on the second conductive layer CL2 and cover the second conductive layer CL2 and the second inorganic insulating layer IL2, for example.

A first upper opening 4501, a second upper opening 4502, and a third upper opening 4503 may be defined in the light-blocking patterns 450. The first upper opening 4501, the second upper opening 4502, and the third upper opening 4503 may expose a portion of the upper surface of the second inorganic insulating layer IL2. The first upper opening 4501 may correspond to the first emission area EA1 and vertically overlap the first lower opening 2251. The second upper opening 4502 may correspond to the second emission area EA2 and vertically overlap the second lower opening 2252. The third upper opening 4503 may correspond to the third emission area EA3 and vertically overlap the third lower opening 2253. The light-blocking patterns 450 may include the first to third upper openings 4501, 4502, and 4503 and may have a mesh shape in a plan view. The light-blocking patterns 450 may include an insulating material (e.g., an organic insulating material) and a light-blocking material. The light-blocking material may include a black pigment or a black dye. The light-blocking patterns 450 may be a black matrix, for example. The light-blocking patterns 450 may be disposed to correspond to the non-emission area and may prevent color mixing through light leakage between pixels (P in FIG. 1). The light-blocking patterns 450 may vertically overlap the pixel defining layer 225, and the pixel defining layer 225 may include a light-blocking material as described above. In this case, the light-blocking function by the pixel defining layer 225 and the light-blocking patterns 450 may be maximized.

The light control member 500 may include an adhesive layer 510, a base layer 530, and a dye layer 550. The adhesive layer 510 may be disposed on the touch sensor layer 400 and the light-blocking patterns 450. The adhesive layer 510 may extend into the first upper opening 4501, the second upper opening 4502, and the third upper opening 4503. Accordingly, the first upper opening 4501, the second upper opening 4502, and the third upper opening 4503 may be filled by the adhesive layer 510. The adhesive layer 510 may cover the exposed upper surface of the second inorganic insulating layer IL2. The base layer 530 may be bonded to the touch sensor layer 400 by the adhesive layer 510. The adhesive layer 510 may be in direct contact with the upper surface of the second inorganic insulating layer IL2, the upper surfaces of the light-blocking patterns 450, and the lower surface of the base layer 530. The adhesive layer 510 may be a PSA layer. The adhesive layer 510 may include a transparent polymer. In an embodiment, the adhesive layer 510 may include an acrylic ester, for example.

The base layer 530 may be disposed on the upper surface of the adhesive layer 510. The base layer 530 may be between the adhesive layer 510 and the dye layer 550. The base layer 530 may include a transmissive polymer. In an embodiment, the base layer 530 may include PET, a TAC-based material, PC, PES, PI, PEN, acrylic polymer, and/or any combinations thereof, for example.

The base layer 530 may have a thickness of about 0.01 millimeters (mm) to about 0.1 mm in the third direction (also referred to as a thickness direction D3). Because the base layer 530 has a thickness of 0.01 mm or more, the base layer 530 may sufficiently support the dye layer 550 in the process of forming the dye layer 550. Because the base layer 530 has a thickness of 0.1 mm or less, the display apparatus 1 may be thinned. The base layer 530 may be transparent. In an embodiment, the base layer 530 may transmit pieces of light having the first to third wavelengths, for example. The base layer 530 may not include an ultraviolet blocking material. Accordingly, the base layer 530 may transmit light having a wavelength of about 300 nm to about 380 nm.

The dye layer 550 may be disposed on the upper surface of the base layer 530. The dye layer 550 may have a transmittance of about 0.1% to about 80% with respect to light having a wavelength of about 450 nm to about 650 nm. Specifically, the dye layer 550 may have a transmittance of about 30% to about 80% with respect to pieces of light having the first to third wavelengths. Because the dye layer 550 satisfies the transmittance condition, light output efficiency of light emitted from the display element layer 220 may be improved. When the display apparatus 1 operates, image characteristics of the display apparatus 1 may be improved.

Because the dye layer 550 has a transmittance of about 30% to about 80% with respect to pieces of light having the first, second, and third wavelengths, the display apparatus 1 may not include separate color filters. The dye layer 550 may be unitary on a plurality of pixels (P in FIG. 1). In an embodiment, the dye layer 550 may overlap the first to third emission areas EA1, EA2, and EA3, for example. The dye layer 550 may vertically overlap the first to third upper openings 4501, 4502, and 4503 and may vertically overlap the first to third lower openings 2251, 2252, and 2253. Accordingly, the process of manufacturing the display apparatus 1 may be simplified and the manufacturing efficiency of the display apparatus 1 may be improved.

As described above, the dye layer 550 may include a first dye, a second dye, a third dye, and a fourth dye. The first dye may have a first maximum absorption wavelength. The first maximum absorption wavelength may be in a range of about 420 nm to about 440 nm. The first maximum absorption wavelength may be less than the first wavelength. The first dye may include cyanine or metal porphyrin. In an embodiment, the first dye may include at least one of a material represented by Formula 1-1, a material represented by Formula 1-2, or a material represented by Formula 1-3, for example.

[Formula 1-1]

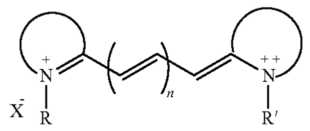

In Formula 1-1, R and R' may each independently be hydrogen, an alkyl group having 1 to 10 carbon atoms, a cycloalkyl group having 3 to 10 carbon atoms, an arylalkyl group having 7 to 20 carbon atoms, an alkenyl group having 2 to 10 carbon atoms, a cycloalkenyl group having 3 to 10 carbon atoms, an alkynyl group having 2 to 10 carbon atoms, a hydroxyl group, a mercapto group, an alkoxy group having 1 to 10 carbon atoms, an alkylthio group having 1 to 10 carbon atoms, an aryl ether group having 6 to 20 carbon atoms, an arylthio ether group having 6 to 20 carbon atoms, an aryl group having 6 to 20 carbon atoms, a heterocycloalkyl group having 2 to 10 carbon atoms, a halogen, a haloalkyl group having 1 to 10 carbon atoms, a haloalkenyl group having 2 to 10 carbon atoms, a haloalkynyl group having 2 to 10 carbon atoms, a cyano group, an aldehyde group having 2 to 10 carbon atoms, a carboxyl group, an amino group, a nitro group, or a silyl group having 1 to 10 carbon atoms, the number of carbon atoms in a ring structure including nitrogen may be 3 to 20, X may be a halogen element or $SO_3^-$, and n may be an integer from 10 to 100,000.

[Formula 1-2]

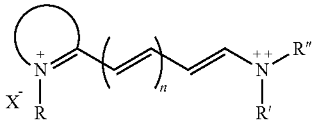

In Formula 1-2, R, R', X, and n may be the same as those defined in Formula 1-1. R" may be hydrogen, an alkyl group having 1 to 10 carbon atoms, a cycloalkyl group having 3 to 10 carbon atoms, an arylalkyl group having 7 to 20 carbon atoms, an alkenyl group having 2 to 10 carbon atoms, a cycloalkenyl group having 3 to 10 carbon atoms, an alkynyl group having 2 to 10 carbon atoms, a hydroxyl group, a mercapto group, an alkoxy group having 1 to 10 carbon atoms, an alkylthio group having 1 to 10 carbon atoms, an aryl ether group having 6 to 20 carbon atoms, an arylthio ether group having 6 to 20 carbon atoms, an aryl group having 6 to 20 carbon atoms, a heterocycloalkyl group having 2 to 10 carbon atoms, a halogen, a haloalkyl group having 1 to 10 carbon atoms, a haloalkenyl group having 2 to 10 carbon atoms, a haloalkynyl group having 2 to 10 carbon atoms, a cyano group, an aldehyde group having 2 to 10 carbon atoms, a carboxyl group, an amino group, a nitro group, or a silyl group having 1 to 10 carbon atoms, and the number of carbon atoms in a ring structure including nitrogen may be 3 to 20.

[Formula 1-3]

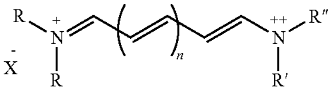

In Formula 1-3, R, R', X, and n may be the same as those defined in Formula 1-1, and R" is the same as that defined in Formula 1-3.

In an embodiment, X in Formulae 1-1, 1-2, and 1-3 may be Cl.

The second dye may have a second maximum absorption wavelength. The second maximum absorption wavelength may be different from the first maximum absorption wavelength. The second maximum absorption wavelength may be in a range of about 495 nm to about 515 nm. The second maximum absorption wavelength may be greater than the first wavelength and less than the second wavelength. In an embodiment, the second wavelength may be a wavelength between the first maximum absorption wavelength and the second maximum absorption wavelength, for example. The second dye may include pyrromethene or boron-dipyrromethane. In an embodiment, the second dye may include a material represented by Formula 2-1 or a material represented by Formula 2-2, for example.

[Formula 2-1]

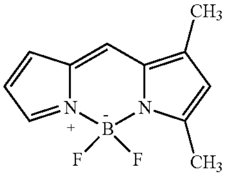

-continued

[Formula 2-2]

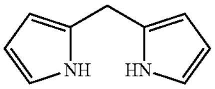

The third dye may have a third maximum absorption wavelength. The third maximum absorption wavelength may be different from the first and second maximum absorption wavelengths. The third maximum absorption wavelength may be in a range of about 585 nm to about 605 nm. The third maximum absorption wavelength may be greater than the second wavelength and less than the third wavelength. The second wavelength may be a wavelength between the second maximum absorption wavelength and the third maximum absorption wavelength. The third dye may include tetraazaporphyrin. In an embodiment, the third dye may include a material represented by Formula 3-1 or a material represented by Formula 3-2, for example.

[Formula 3-1]

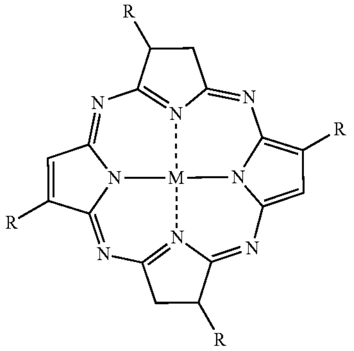

In Formula 3-1, R(s) may be identical to or different from each other and may each independently be hydrogen, an alkyl group having 1 to 10 carbon atoms, a cycloalkyl group having 3 to 10 carbon atoms, an arylalkyl group having 7 to 20 carbon atoms, an alkenyl group having 2 to 10 carbon atoms, a cycloalkenyl group having 3 to 10 carbon atoms, an alkynyl group having 2 to 10 carbon atoms, a hydroxyl group, a mercapto group, an alkoxy group having 1 to 10 carbon atoms, an alkylthio group having 1 to 10 carbon atoms, an aryl ether group having 6 to 20 carbon atoms, an arylthio ether group having 6 to 20 carbon atoms, an aryl group having 6 to 20 carbon atoms, a heterocycloalkyl group having 2 to 10 carbon atoms, a halogen, a haloalkyl group having 1 to 10 carbon atoms, a haloalkenyl group having 2 to 10 carbon atoms, a haloalkynyl group having 2 to 10 carbon atoms, a cyano group, an aldehyde group having 2 to 10 carbon atoms, a carboxyl group, an amino group, a nitro group, or a silyl group having 1 to 10 carbon atoms, M may be Pd, Cu, Ru, Pt, Ni, Co, Rh, Zn, VO, TiO, $Si(Y)_2$, $Sn(Y)_2$, or Ge(Y)2, and Y may be a halogen atom, an alkoxy group having 1 to 10 carbon atoms, an aryloxy group having 6 to 20 carbon atoms, a hydroxyl group, an acryloxy group having 2 to 10 carbon atoms, an alkyl group having 1 to 10 carbon atoms, an aryl group having 6 to 20 carbon atoms, an alkylthio group having 1 to 10 carbon atoms, an arylthio group having 6 to 20 carbon atoms.

[Formula 3-2]

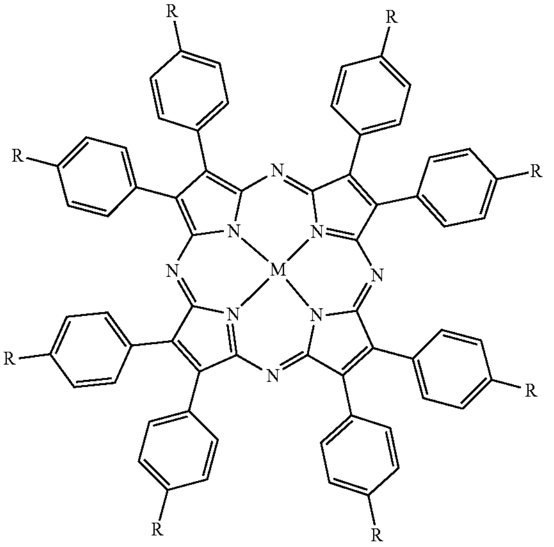

In Formula 3-2, R and M may be the same as those defined in Formula 3-1.

The fourth dye may have a fourth maximum absorption wavelength. The fourth maximum absorption wavelength may be different from the first to third maximum absorption wavelengths. The fourth maximum absorption wavelength may be in a range of about 670 nm to about 690 nm. The fourth maximum absorption wavelength may be greater than the third wavelength. The third wavelength may be a wavelength between the third maximum absorption wavelength and the fourth maximum absorption wavelength. The fourth dye may include phthalocyanine. In an embodiment, the fourth dye may include a material represented by Formula 4, for example.

[Formula 4]

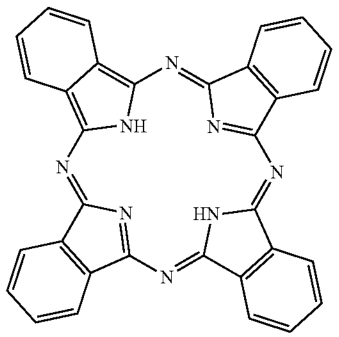

By embodiments, the light transmittance of the dye layer 550 according to the wavelength band may be adjusted by controlling the content ratios of the first to fourth dyes. In an embodiment, the content ratio of the first dye in the dye layer 550 may be in a range of about 0.01 weight percent (wt %) to about 2 wt %, for example. The content ratio of the second dye may be in a range of about 0.01 wt % to about 2 wt %. The content ratio of the third dye may be in a range of about 0.01 wt % to about 2 wt %. The content ratio of the fourth dye may be in a range of about 0.01 wt % to about 2 wt %. By embodiments, when the content ratios of the first to fourth dyes satisfy these ranges, the dye layer 550 may satisfy a transmittance of about 30% to about 80% with respect to pieces of light having the first to third wavelengths.

In addition, when the content ratios of the first to fourth dyes satisfy these ranges, the transmittance of the dye layer 550 may be 80% or less (e.g., in a range of about 0.1% to about 80%) at the first to fourth maximum absorption wavelengths.

Each of the adhesive layer 510, the base layer 530, and the dye layer 550 may not include bismuth. A layer including bismuth may not be provided on the display element layer 220. The adhesive layer 510, the base layer 530, and the dye layer 550 may have relatively high transmittance with respect to light having a near-infrared ("NIR") wavelength. In an embodiment, the adhesive layer 510, the base layer 530, and the dye layer 550 may each have a transmittance of about 80% to about 99.5% with respect to light having a wavelength of about 710 nm to about 1,000 nm, for example. Specifically, the dye layer 550 may have a transmittance of about 85% to about 99.5% with respect to light having a wavelength of about 900 nm to about 1,000 nm. An electronic apparatus including the display apparatus 1, in embodiments, may function as a UPS or a UPC. In an embodiment, the electronic apparatus may further include a camera or a sensor below the display apparatus 1, for example. Because the adhesive layer 510, the base layer 530, and the dye layer 550 each have relatively high transmittance with respect to light having a wavelength of about 710 nm to about 1,000 nm, an external image may be sensed by the camera or the sensor through the display apparatus 1. By embodiments, applicability of the display apparatus 1 and the electronic apparatus including the same may expand.

The display panel DP may have a specular component included ("SCI") reflectance of about 4% to about 6.5%. The SCI reflectance may refer to reflectance including specularly reflected light. In an embodiment, the display panel DP may satisfy the SCI reflectance condition for light having a wavelength of about 380 nm to about 740 nm, for example. In the specification, the reflectance of the display panel DP may refer to reflectance measured on the upper surface of the dye layer 550 with respect to light emitted from the display element layer 220 and transmitted through the layers stacked between the display element layer 220 and the dye layer 550. The reflectance of the display panel DP may be defined as reflectance when the window adhesive layer OCA and the cover window 600 are omitted. The display panel DP may have an SCI reflectance of about 4% to about 6.5% with respect to pieces of light having the first to third wavelengths. Accordingly, external reflection efficiency of the display apparatus 1 may be improved.

The display panel DP may have a specular component excluded (SCE) reflectance of about 0.2% to about 1%. The SCE reflectance may refer to reflectance when specularly reflected light is excluded. In an embodiment, the display panel DP may satisfy the SCE reflectance condition for light having a wavelength of about 380 nm to about 740 nm, for example. The display panel DP may have an SCE reflectance of about 0.2% to about 1% with respect to pieces of light having the first to third wavelengths. Accordingly, internal reflection efficiency of the display apparatus 1 may be improved.

By embodiments, because the dye layer 550 includes the first to fourth dyes and the content ratios of the first to fourth dyes satisfy the condition described above, the display panel DP may satisfy the SCI reflectance and the SCE reflectance within the ranges described above. When the SCI reflectance and the SCE reflectance satisfy the ranges described above, the display apparatus 1 may exhibit improved reflective color and black visibility characteristics. By embodiments, the display apparatus 1 may exhibit improved luminance characteristics. Accordingly, power consumption of the of the display apparatus 1 may be reduced.

The thickness of the dye layer 550 may be controlled so that the transmittance of the dye layer 550 and the SCI reflectance and the SCE reflectance of the display panel DP are adjusted and the display apparatus 1 implements desired color coordinate characteristics. The dye layer 550 may have a thickness of about 0.002 mm to about 0.1 mm. Accordingly, the dye layer 550 may satisfy the transmittance range, the SCI range, and the SCE range. Accordingly, the emission efficiency of the dye layer 550 may be increased and the reflective color and black visibility characteristics may be improved.

The dye layer 550 is the uppermost layer of the light control member 500 and may be disposed adjacent to the cover window 600. In an embodiment, the window adhesive layer OCA may be disposed directly on the dye layer 550, and the dye layer 550 may be bonded to the cover window 600 through the window adhesive layer OCA, for example. Accordingly, as indicated by the arrow in FIG. 4B, even when light incident from the outside is reflected at an interface between the dye layer 550 and the base layer 530, the reflected light may be absorbed by the dye layer 550. Accordingly, the reflected light may not be emitted to the outside. Similarly, even when light incident from the outside is reflected at an interface between two predetermined layers below the dye layer 550, the reflected light may be absorbed by the dye layer 550. In FIG. 4B, for the simplification of the drawing, only a case where light reflected at the interface between the dye layer 550 and the base layer 530, light reflected at the interface between the base layer 530 and the adhesive layer 510, and light reflected at the interface between the adhesive layer 510 and the second inorganic insulating layer IL2 are absorbed by the dye layer 550 is illustrated, but light may be further reflected at the interface between two predetermined layers below the adhesive layer 510 and the light may be absorbed by the dye layer 550. By embodiments, reflection characteristics of the display apparatus 1 may be improved.

The dye layer 550 may further include a binder. The binder may include an acrylic material, for example. In an embodiment, the binder may include an acrylic material having a cyano group, for example. In an alternative embodiment, the binder may include a monomer or resin, and the monomer or resin may have epoxy, urethane, ester, a hydroxyl group, and/or a carboxyl group. The dye layer 550 may further include an initiator and/or a surfactant.

The window adhesive layer OCA may be disposed on the dye layer 550. The window adhesive layer OCA may further include an optically clear adhesive. The window adhesive layer OCA may include an organic material such as a polymer. In an embodiment, the window adhesive layer OCA may further include an ultraviolet blocking material, for example. The ultraviolet blocking material may be an organic ultraviolet blocking material. The organic ultraviolet blocking material may include at least one of benzophenone and derivatives thereof, oxalanilide and derivatives thereof, benzotriazole and derivatives thereof, or triazine and derivatives thereof, for example. When the window adhesive layer OCA includes an ultraviolet blocking material, the window adhesive layer OCA may have relatively low ultraviolet transmittance. In an embodiment, the window adhesive layer OCA may have a transmittance of 2% or less with respect to light having a wavelength of about 300 nm to about 380 nm, for example.

The cover window 600 may be disposed on the window adhesive layer OCA. The cover window 600 may further include an ultraviolet blocking material, and the ultraviolet blocking material may include an inorganic ultraviolet blocking material. The inorganic ultraviolet blocking material may include metal and/or metal oxide. When the cover window 600 includes an ultraviolet blocking material, the cover window 600 may have a transmittance of 2% or less with respect to light having a wavelength of about 300 nm to about 380 nm.

By embodiments, a stacked structure including the window adhesive layer OCA and the cover window 600 may have a transmittance of 2% or less with respect to light having a wavelength of about 300 nm to about 380 nm.

Figure 5:
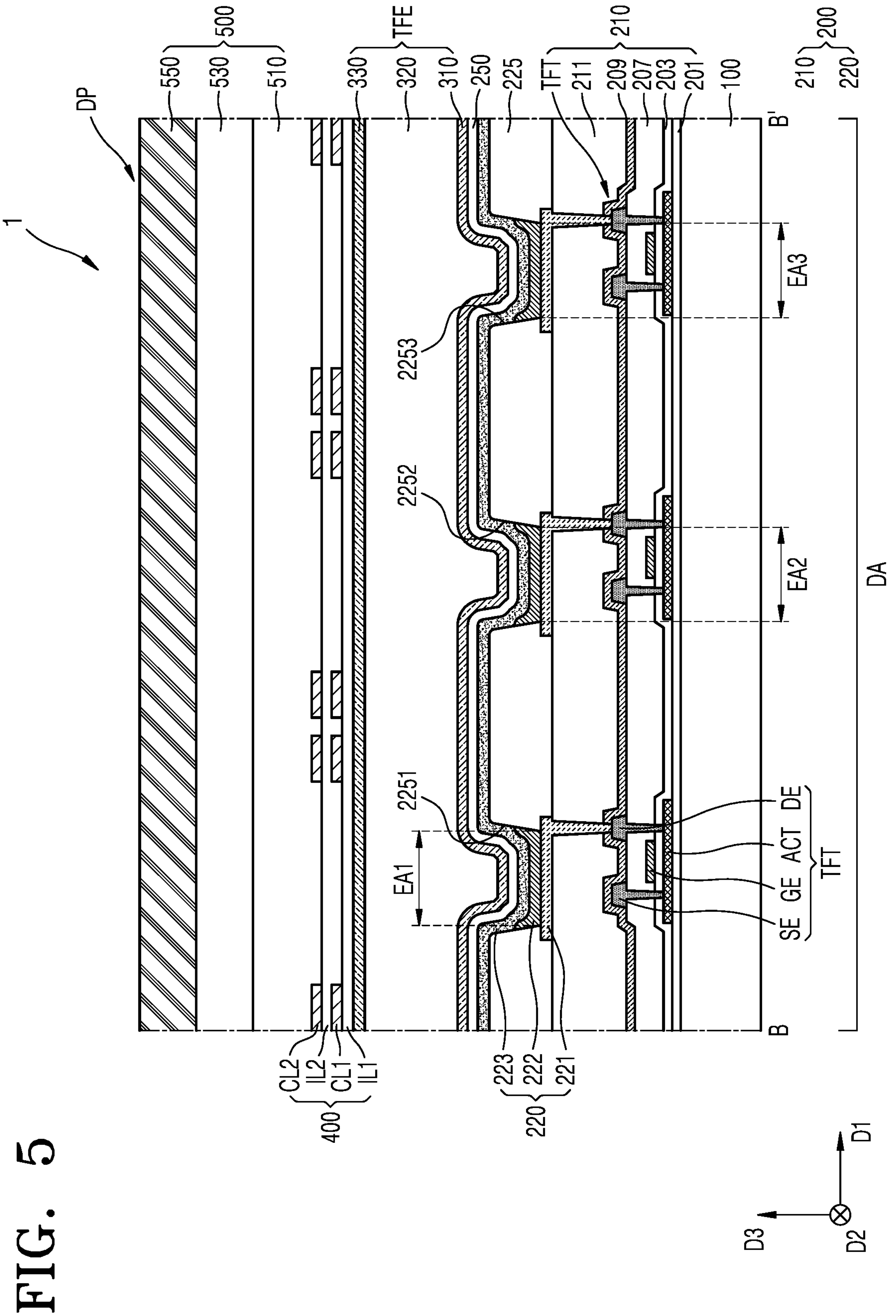
FIG. 5 is a cross-sectional view schematically illustrating a display apparatus according to other embodiments.

FIG. 5 is a schematic cross-sectional view of the display apparatus 1 of FIG. 1 taken along line B-B' of FIG. 1, according to other embodiments.

Referring to FIG. 5, the display apparatus 1 may include a substrate 100, a pixel layer 200, an encapsulation layer TFE, a touch sensor layer 400, a light control member 500, a window adhesive layer OCA, and a cover window 600. However, the display apparatus 1 may not include light-blocking patterns (450 of FIGS. 4A and 4B). The adhesive layer 510 may be disposed on an upper surface of a second inorganic insulating layer IL2 and may cover the upper surface of the second inorganic insulating layer IL2.

Hereinafter, manufacturing and evaluation results of a dye layer and a display panel including the same will be described with reference to experimental embodiments.

(1) Embodiment 1

A preliminary material was prepared by mixing a binder with a first dye including at least one of materials represented by Formulae 1-1, 1-2, and 1-3, a second dye including at least one of materials represented by Formulae 2-1 and 2-2, a third dye including at least one of materials represented by Formulae 3-1 and 3-2, and a fourth dye represented by Formula 4. A dye layer having a thickness of about 6 micrometers (μm) was formed by hard-coating the preliminary material on a transparent base layer. A light control member was formed by bonding a pressure sensitive adhesive layer to the lower surface of the transparent base layer. As described with reference to FIG. 4A, a display panel was formed by the light control member.

(2) Embodiment 2

A light control member and a display panel were formed in the same manner as described in Embodiment 1. However, a dye layer was formed to a thickness of 7 μm.

Table 1 shows results of measuring the SCI reflectance, SCE reflectance, and luminance ratio of the display panels according to Experimental Embodiments 1 and 2. The SCI reflectance, SCE reflectance, and luminance ratio were measured under D65 and 8-degree direction light-receiving conditions by a CM-3700A equipment available from Konica Minolta. At this time, the SCI reflectance, the SCE reflectance, and the luminance ratio of the panel were measured by a display panel in which a window adhesive layer and a cover window were not formed on a dye layer. The luminance ratio represents the luminance of the display panel of Experimental Embodiment 1 and the luminance of the display panel of Experimental Embodiment 2 relative to the luminance of the display panel of Comparative Example including a polarizer instead of the light control member.

TABLE 1

| | | Embodiment 1 | Embodiment 2 |
|---|---|---|---|
| Thickness (μm) of dye layer | | 6 | 7 |
| SCI | Y (reflectance) (%) | 6.47 | 5.97 |
| SCE | Y (reflectance) (%) | 0.91 | 0.69 |
| | a* | 1.59 | 2 |
| | b* | −0.43 | −0.2 |
| Measured value | x | 0.2858 | 0.2854 |
| | y | 0.3242 | 0.3187 |
| | Luminance | 441.1 | 383 |
| | Luminance ratio | 144% | 99% |

Referring to Table 1, the display panel of Embodiment 1 and the display panel of Embodiment 2 satisfy an SCI reflectance of 4% to 6.5% and an SCE reflectance of 0.2% to 1%. In addition, the display panel of Embodiment 1 and the display panel of Embodiment 2 exhibit similar or higher luminance characteristics, compared to the display panel of Comparative Example including the polarizer instead of the light control member.

Figure 6:
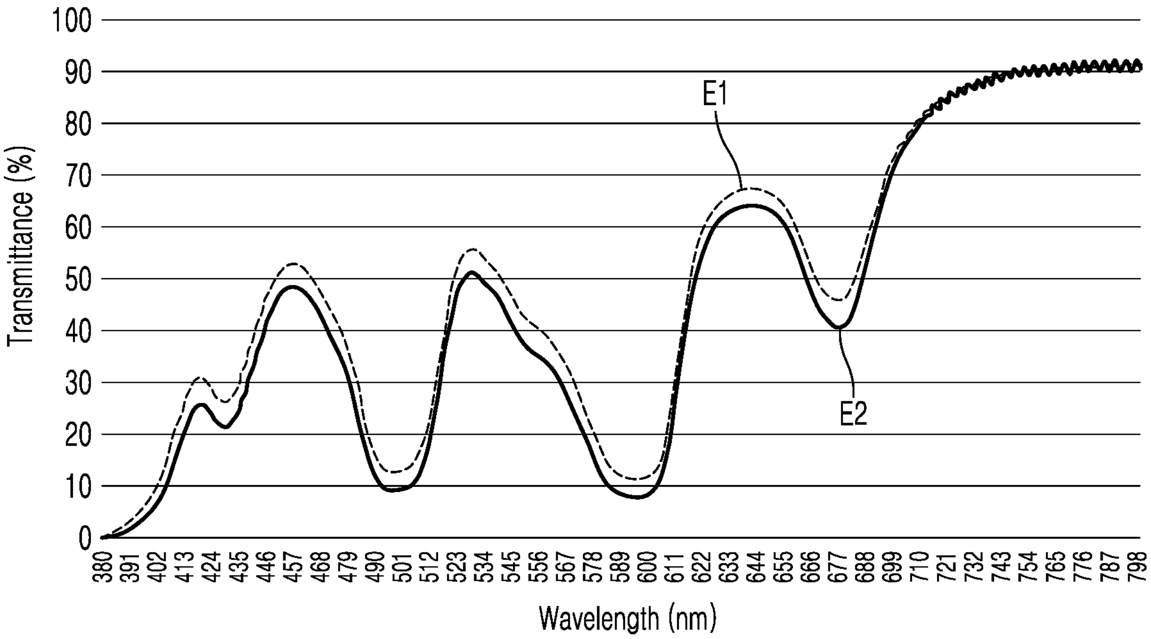
FIG. 6 is a graph showing results of evaluating transmittance of a dye layer of Experimental Embodiment 1 and a dye layer of Experimental Embodiment 2 according to a wavelength of light.

FIG. 6 is a graph showing results of evaluating transmittance of the dye layer of Experimental Embodiment 1 and the dye layer of Experimental Embodiment 2 according to the wavelength of light.

Referring to FIG. 6, the dye layer of Experimental Embodiment 1 (E1) and the dye layer of Experimental Embodiment 2 (E2) each have a transmittance of 80% or less in an entirety of the wavelength of 450 nm to 650 nm. The dye layer of Experimental Embodiment 1 (E1) and the dye layer of Experimental Embodiment 2 (E2) each have a transmittance of 30% to 80% with respect to a first wavelength of 455 nm to 475 nm, a second wavelength of 520 nm to 540 nm, and a third wavelength of 620 nm to 640 nm.

By embodiments, the light control member may include a dye layer, and the dye layer may be disposed on the upper portion of the light control member. Accordingly, the display apparatus may exhibit improved light output efficiency. The arrangement of the dye layers, the types of the dyes included in the dye layers, and the content of the dyes are controlled so that the display apparatus implements improved image characteristics and desired color coordinates. The display apparatus may exhibit improved reflection characteristics and improved black visibility. These effects are only examples and the scope of the disclosure is not limited by such effects.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:

a substrate;

a display element layer on the substrate;

a cover window on the display element layer;

an adhesive layer between the display element layer and the cover window;

a base layer between the adhesive layer and the cover window;

a dye layer between the base layer and the cover window, the dye layer including:

a first dye having a maximum absorption wavelength; and a second dye having a maximum absorption wavelength which is different from the maximum absorption wavelength of the first dye; and a window adhesive layer between the dye layer and the cover window, wherein at least one of the window adhesive layer and the cover window includes an ultraviolet blocking material.

2. The display apparatus of claim 1, wherein the dye layer further comprises:

a third dye having a maximum absorption wavelength which is different from the maximum absorption wavelengths of the first dye and the second dye; and a fourth dye having a maximum absorption wavelength which is different from the maximum absorption wavelengths of the first dye, the second dye, and the third dye.

3. The display apparatus of claim 1, wherein the dye layer has a transmittance of about 30% to about 80% with respect to light having a wavelength of about 455 nanometers to about 475 nanometers, has a transmittance of about 30% to about 80% with respect to light having a wavelength of about 520 nanometers to about 540 nanometers, and has a transmittance of about 30% to about 80% with respect to light having a wavelength of about 620 nanometers to about 640 nanometers.

4. The display apparatus of claim 1, wherein a stacked structure comprising the window adhesive layer and the cover window has a transmittance of about 2% or less with respect to light having a wavelength of about 300 nanometers to about 380 nanometers.

5. The display apparatus of claim 1, wherein the window adhesive layer includes an organic ultraviolet blocking material.

6. The display apparatus of claim 1, wherein the cover window includes an inorganic ultraviolet blocking material.

7. The display apparatus of claim 1, further comprising a touch sensor layer on the display element layer, wherein the adhesive layer contacts at least a portion of an upper surface of the touch sensor layer.

8. The display apparatus of claim 7, further comprising light-blocking patterns on the touch sensor layer and defining upper openings, wherein the adhesive layer covers the light-blocking patterns and extends into the upper openings.

9. The display apparatus of claim 1, wherein the adhesive layer has a transmittance of about 80% to about 99.5% with respect to light having a wavelength of about 710 nanometers to about 1,000 nanometers, the base layer has a transmittance of about 80% to about 99.5% with respect to light having a wavelength of about 710 nanometers to about 1,000 nanometers, and the dye layer has a transmittance of about 80% to about 99.5% with respect to light having a wavelength of about 710 nanometers to about 1,000 nanometers.

10. The display apparatus of claim 1, wherein each of the adhesive layer, the base layer, and the dye layer does not include bismuth.

11. The display apparatus of claim 1, further comprising:

a capping layer on the display element layer and including an organic material; and an encapsulation layer on the capping layer, wherein the encapsulation layer is disposed directly on the capping layer so that the encapsulation layer contacts the capping layer.

12. The display apparatus of claim 11, wherein the display element layer comprises a pixel electrode, an emission layer, and an opposite electrode, which are sequentially stacked, and the capping layer is between the opposite electrode and the encapsulation layer.

13. A display apparatus comprising:

a substrate;

a display panel on the substrate and comprising:

a display element layer; and a light control member comprising:

an adhesive layer;

a base layer; and a dye layer comprising:

a first dye having a first maximum absorption wavelength;

a second dye having a second maximum absorption wavelength;

a third dye having a third maximum absorption wavelength; and a fourth dye having a fourth maximum absorption wavelength; and a cover window on the light control member, wherein the adhesive layer, the base layer, and the dye layer are stacked on the display element layer, the dye layer is between the base layer and the cover window, and the dye layer has a transmittance of about 30% to about 80% with respect to light having a first wavelength of about 455 nanometers to about 475 nanometers, has a transmittance of about 30% to about 80% with respect to light having a second wavelength of about 520 nanometers to about 540 nanometers, and has a transmittance of about 30% to about 80% with respect to light having a third wavelength of about 620 nanometers to about 640 nanometers.

14. The display apparatus of claim 13, wherein the first wavelength is a wavelength between the first maximum absorption wavelength and the second maximum absorption wavelength, the second wavelength is a wavelength between the second maximum absorption wavelength and the third maximum absorption wavelength, and the third wavelength is a wavelength between the third maximum absorption wavelength and the fourth maximum absorption wavelength.

15. The display apparatus of claim 13, wherein a content ratio of the first dye in the dye layer is in a range of about 0.01 weight percent to about 2 weight percent, a content ratio of the second dye in the dye layer is in a range of about 0.01 weight percent to about 2 weight percent, a content ratio of the third dye in the dye layer is in a range of about 0.01 weight percent to about 2 weight percent, and a content ratio of the fourth dye in the dye layer is in a range of about 0.01 weight percent to about 2 weight percent.

16. The display apparatus of claim 13, wherein the display panel has a specular component included ("SCI") reflectance of about 4% to about 6.5%.

17. The display apparatus of claim 13, wherein the display panel has a specular component excluded ("SCE") reflectance of about 0.2% to about 1%.

18. The display apparatus of claim 13, wherein the dye layer has a transmittance of about 80% to about 99.5% with respect to light having a wavelength of about 900 nanometers to about 1,000 nanometers.

19. The display apparatus of claim 13, further comprising:

a thin-film encapsulation layer on the display element layer;

a touch sensor layer on the thin-film encapsulation layer; and a window adhesive layer between the dye layer and the cover window, wherein the adhesive layer is disposed on the touch sensor layer, and the window adhesive layer contacts an upper surface of the dye layer.

20. The display apparatus of claim 13, wherein the dye layer includes a transmissive polymer, and the adhesive layer includes a pressure sensitive adhesive layer.

* * * * *